US008888911B2

(12) United States Patent
Uto et al.

(10) Patent No.: US 8,888,911 B2
(45) Date of Patent: Nov. 18, 2014

(54) METHOD OF PRODUCING SINGLE CRYSTAL SILICON

(75) Inventors: Masayuki Uto, Tokyo (JP); Tuneaki Tomonaga, Tokyo (JP); Toshimichi Kubota, Tokyo (JP); Fukuo Ogawa, Tokyo (JP); Yasuhito Narushima, Tokyo (JP)

(73) Assignee: Sumco Techxiv Corporation, Nagasaki (JP)

( * ) Notice: Subject to any disclaimer, the term of this patent is extended or adjusted under 35 U.S.C. 154(b) by 1051 days.

(21) Appl. No.: 12/875,607

(22) Filed: Sep. 3, 2010

(65) Prior Publication Data
US 2011/0056428 A1 Mar. 10, 2011

(30) Foreign Application Priority Data

Sep. 7, 2009 (JP) ................. 2009-206441

(51) Int. Cl.
*C30B 15/22* (2006.01)
*C30B 29/06* (2006.01)
*C30B 15/20* (2006.01)
*C30B 15/04* (2006.01)
*C30B 15/00* (2006.01)
*C30B 15/30* (2006.01)

(52) U.S. Cl.
CPC ............. *C30B 29/06* (2013.01); *C30B 15/04* (2013.01); *C30B 15/00* (2013.01); *C30B 15/20* (2013.01); *C30B 15/30* (2013.01); *C30B 15/22* (2013.01)
USPC ............ 117/35; 117/13; 117/14; 117/15; 117/19; 117/32; 117/38; 117/39; 117/201; 117/202; 117/206; 117/208

(58) Field of Classification Search
CPC ............................ C30B 29/06; C30B 15/04
USPC .................................... 117/35, 13
See application file for complete search history.

(56) References Cited

U.S. PATENT DOCUMENTS

2003/0154907 A1* 8/2003 Inagaki et al. ............ 117/19
2005/0215057 A1 9/2005 Kashima
2006/0005761 A1* 1/2006 Kulkarni et al. .......... 117/15

FOREIGN PATENT DOCUMENTS

JP S62288195 A 12/1987
JP 2004 165489 6/2004
JP 2005-231944 A 9/2005

(Continued)

OTHER PUBLICATIONS

Interantional Search Report, EP 10 17 5492, Mailed Nov. 15, 2010.

(Continued)

*Primary Examiner* — Michael Kornakov
*Assistant Examiner* — Hua Qi
(74) *Attorney, Agent, or Firm* — Thomas J. Engellenner; Reza Mollaaghababa; Pepper Hamilton LLP

(57) ABSTRACT

The present invention provides a technique which enables production of single crystal silicon having relatively low resistivity by preventing cell growth during crystal growth from occurring, especially in a case where a relatively large amount of dopant is added to a molten silicon raw material. Specifically, the present invention provides a method of producing single crystal silicon by the Czochralski process, comprising producing single crystal silicon having relatively low resistivity by controlling a height of a solid-liquid interface when the single crystal silicon is pulled up.

9 Claims, 10 Drawing Sheets

(56) References Cited

FOREIGN PATENT DOCUMENTS

| | | | | |
|---|---|---|---|---|
| JP | 2005314213 | | 11/2005 | |
| JP | 2008-297166 A | | 12/2008 | |
| JP | 2008297166 A | * | 12/2008 | .............. C30B 29/06 |
| JP | 2008297167 A | | 12/2008 | |
| WO | WO 2008/146725 | | 12/2008 | |

OTHER PUBLICATIONS

Japanese Office Action in Applicants' corresponding Japanese patent application No. 2009-206441 dated Nov. 12, 2013 (2 pages).

Japanese Office Action in corresponding Japanese patent application No. 2009-206441 dated Mar. 11, 2014 (5 pages).

* cited by examiner

Collecting cut block $S_1$

Longitudinal cutting of cut block

Elimination of residual strain caused by machining

X-ray observation

US 8,888,911 B2

METHOD OF PRODUCING SINGLE CRYSTAL SILICON

BACKGROUND OF THE INVENTION

1. Field of the Invention

The present invention relates to a method of producing single crystal silicon by the Czochralski process, in particular, to a method of producing single crystal silicon having relatively low resistivity.

2. Description of Related Art

There has been a demand, in recent years, for single crystal silicon having relatively low resistivity to improve performance of a semiconductor device product.

Resistivity of a silicon wafer is generally determined in accordance with an added amount of a dopant (s).

For example, in a case of N-type single crystal silicon, a dopant such as a very small amount of phosphorus (P), antimony (Sb), arsenic (As) and germanium (Ge) is added to a molten silicon raw material for the purpose of controlling resistivity.

Regarding decreasing resistivity of single crystal silicon, JP 2005-314213 Laid-Open proposes producing single crystal silicon having resistivity of 2.0 mΩ·cm or so by using arsenic as dopant and doping silicon with arsenic such that a mol ratio of silicon with respect to arsenic is in the range of 45 to 50%.

SUMMARY OF THE INVENTION

A relatively small device such as a mobile phone has been widely in use in recent years. There is a strong demand that such a small device as a mobile phone should remain usable for a relatively long period in a mobile state, and thus there has been made attempts to increase a capacity of a battery installed inside the small device and/or to decrease power consumption of the small device itself. In order to decrease power consumption of a small device itself, it is necessary to decrease power consumption of a semiconductor device mounted inside the small device.

For example, a low voltage power MOSPET (Metal Oxide Semiconductor Field Effect Transistor) used as a power device in such a small device as described above consumes electricity by itself in accordance with a current flow through the low voltage power MOSFET because the MOSFET has a certain level of resistance inside in an "ON" (conduction) state thereof. Accordingly, electric power consumption of a small device can be decreased by decreasing the internal resistance of a low voltage power MOSEET in an ON state thereof. Due to such a background as described above, there has been a strong demand for n-type single crystal having relatively low resistivity in order to reduce resistance of a lower voltage power MOSFET in an ON state thereof.

In order to realize further reduction of resistance, a further larger amount of dopant must be added to a molten silicon raw material. In a case where single crystal silicon is produced by employing the Czochralski process and adding a relatively large amount of dopant in such a manner, there arises a problem in that what is called "cell growth" occurs during pulling-up crystal, disturbing single crystallization.

In the present invention, "cell growth" represents a phenomenon caused by constitutional undercooling in crystal growth. Specifically, cell growth occurs due to decrease in a ratio of a temperature gradient in the direction of crystal growth with respect to a growth rate and becomes a factor of inhibiting single crystallization.

In view of the problems described above, an object of the present invention is to provide a technique which enables production of single crystal silicon having relatively low resistivity by preventing cell growth during crystal growth from occurring, especially in a case where a relatively large amount of dopant is added to a molten silicon raw material.

The inventors paid attention, in particular, to striations (growth striations) distinctively appearing in an impurity (dopant)-doped crystal and keenly studied a relationship between striations and occurrence of cell growth. As a result, they discovered that no cell growth occurs, i.e. a crystal grows without dislocations, in a case where striations exhibit a convex shape in the direction of crystal growth. The inventors then further studied in detail a relationship between the shapes of striations and presence/absence of dislocations in each produced ingot and discovered that, provided that a "height of a striation" in an ingot is expressed as a magnitude of displacement of the striation in the crystal growth direction from an end, in the radial direction, of the ingot, there exists a very strong correlation between the height of the striation and the cell growth in the ingot. A striation represents a solid-liquid interface in crystal growth. Accordingly, the inventors have newly discovered that it is possible to cause crystal growth to occur without dislocations even in a case where a relatively large amount of dopant is added, by controlling a height of a solid-liquid interface during crystal growth.

Specifically, the essential features of the present invention are as follows.

1. A method of producing single crystal silicon by the Czochralski process, comprising producing single crystal silicon having relatively low resistivity by controlling a height of a solid-liquid interface when the single crystal silicon is pulled up.

2. A method of producing single crystal silicon, comprising controlling, when a single crystal silicon having 8-inch diameter is pulled up from a molten silicon containing P and Ge added thereto, the height (x) of a solid-liquid interface such that x satisfies the formula (1) below regarding dopant concentration y of the single crystal silicon.

$$y \leq (1.235 \times 10^{13})x^3 - (1.310 \times 10^{25})x^2 + (4.357 \times 10^{18})x + 2.715 \times 10^{20} \quad (1)$$

3. A method of producing single crystal silicon, comprising controlling, when a single crystal silicon having 6-inch diameter is pulled up from a molten silicon containing P and Ge added thereto, the height (x) of a solid-liquid interface such that x satisfies the formula (2) below regarding dopant concentration y of the single crystal silicon.

$$y \leq (2.042 \times 10^{14})x^3 - (4.674 \times 10^{14})x^2 + (4.242 \times 10^{18})x + 3.107 \times 10^{20} \quad (2)$$

4. A method of producing single crystal silicon, comprising controlling, when a single crystal silicon having 8-inch diameter is pulled up from a molten silicon containing P added thereto, the height (x) of a solid-liquid interface such that x satisfies the formula (3) below regarding dopant concentration y of the single crystal silicon.

$$y \leq (1.235 \times 10^{13})x^3 - (1.310 \times 10^{15})x^2 + (4.356 \times 10^{18})x + 2.715 \times 10^{20} \quad (3)$$

5. A method of producing single crystal silicon, comprising controlling, when a single crystal silicon having 6-inch diameter is pulled up from a molten silicon containing P added thereto, the height (x) of a solid-liquid interface such that x satisfies the formula (4) below regarding dopant concentration y of the single crystal silicon.

$$y \leq (2.042 \times 10^{14})x^3 - (4.674 \times 10^{14})x^2 + (4.242 \times 10^{18})x + 3.107 \times 10^{20} \quad (4)$$

6. A method of producing single crystal silicon, comprising controlling, when a single crystal silicon having 8-inch diameter is pulled up from a molten silicon containing As added thereto, the height (x) of a solid-liquid interface such that x satisfies the formula (5) below regarding dopant concentration y of the single crystal silicon.

$$y \leq (4.273 \times 10^{12})x^3 - (1.978 \times 10^{14})x^2 + (8.134 \times 10^{17})x + 5.008 \times 10^{19} \quad (5)$$

7. A method of producing single crystal silicon, comprising controlling, when a single crystal silicon having 6-inch diameter is pulled up from a molten silicon containing As added thereto, the height (x) of a solid-liquid interface such that x satisfies the formula (6) below regarding dopant concentration y of the single crystal silicon.

$$y \leq (4.009 \times 10^{13})x^3 - (8.890 \times 10^{12})x^2 + (7.934 \times 10^{17})x + 5.740 \times 10^{19} \quad (6)$$

8. A method of producing single crystal silicon of the method 1 above, further comprising controlling the height of a solid-liquid interface by adjusting at least one of a rotational rate of crystal, a rotational rate of a crucible, and strength of magnetic field applied to a molten silicon during a pulling-up operation of the crystal.

According to the present invention, single crystal silicon having extremely low resistivity can be reliably produced because cell growth can be avoided and dislocation-free crystal growth can be realized even in a case where a relatively large amount of dopant is added.

DESCRIPTION OF THE PREFERRED EMBODIMENTS

Figure 1A:
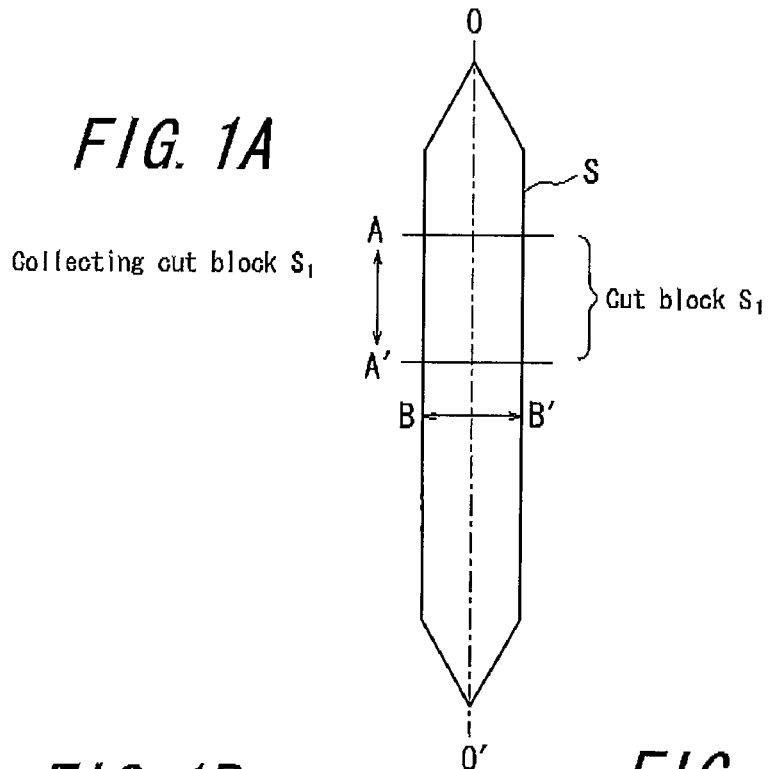
FIGS. 1A, 1B, 1C and 1D are explanatory views showing a technique of observing striations in single crystal silicon.

As described above, the inventors of the present invention paid particular attention to striations distinctively appearing in an impurity-doped crystal and contrived the present invention on the basis of the results of a keen study regarding correlation between these striations and presence/absence of cell growth. The results of experiments which led to the present invention will be described in detail hereinafter. First, striations in each of ingots obtained under various production conditions are examined. Specifically, as shown in FIG. 1A, a single crystal silicon ingot is cut at predetermined sites, for example, A-A' and B-B' shown in the drawing, whereby a cut block $S_1$ is obtained.

Figure 1B:
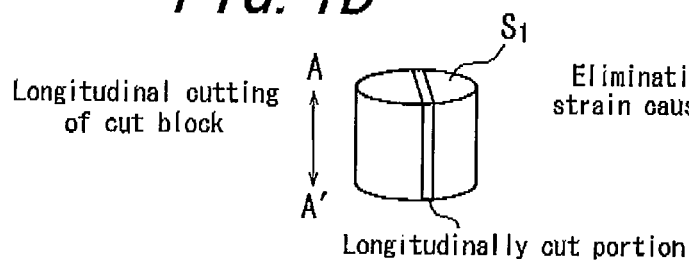

Next, as shown in FIG. 1B, the cut block $S_1$ is further cut along the longitudinal axis O-O' of the original ingot, whereby a longitudinally cut portion is collected.

Figure 1C:
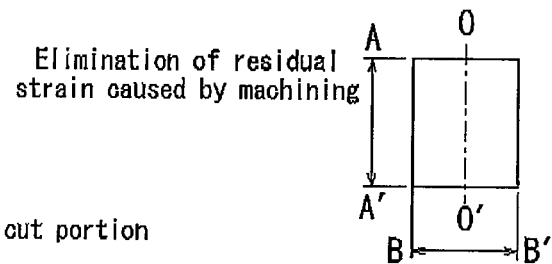
Figure 1D:
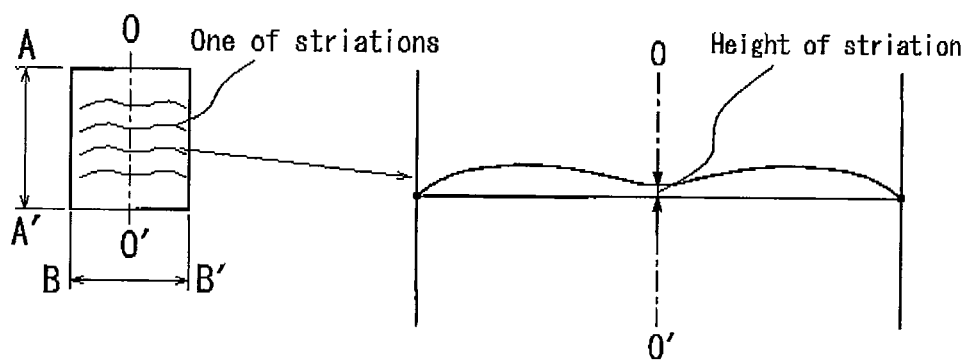
Figure 2:
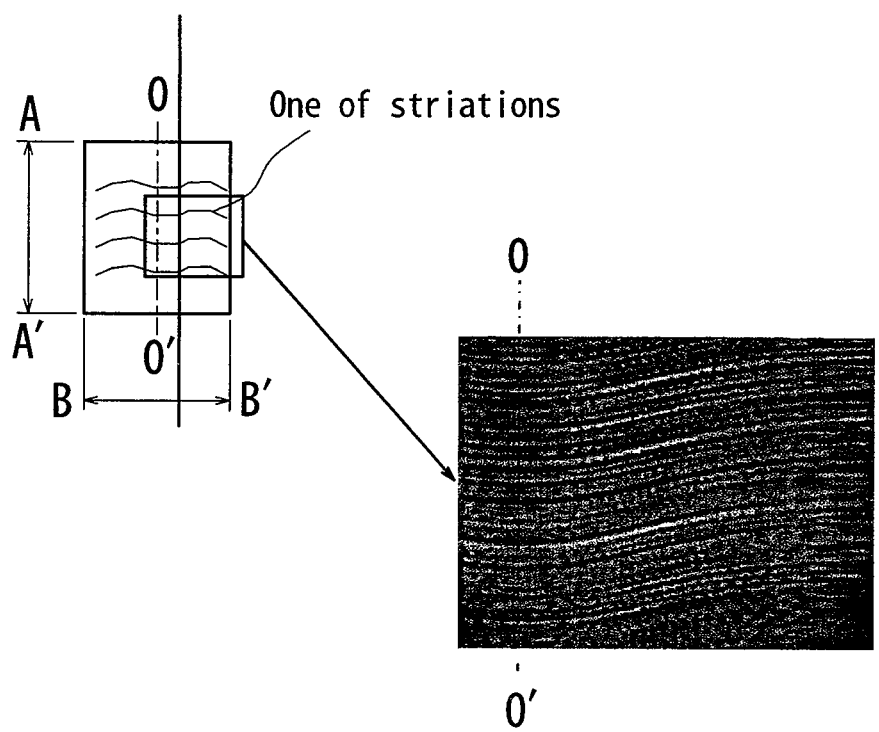
FIG. 2 is a view showing an example of striations.

Next, as shown in FIG. 1C, the longitudinally cut portion thus collected is subjected to an etching process such that residual strain by machining up to the operation of collecting the longitudinally cut portion is eliminated. Thereafter, an X-ray observation is carried out for the longitudinally cut portion from which residual strain by machining has been thus eliminated and striations are examined, as shown in FIG. 1D. An example of striations observed by the X-ray observation is shown in FIG. 2. A number of striations can be observed as shown in the drawing.

Regarding each striation of a number of striations described above, provided that a striation edge at a side edge (an end in the ingot-radial direction) of the longitudinally cut portion thus collected is set at the origin (zero point), the distance along the growth axis O-O' of the single crystal silicon measured between the y=0 edge and the intersection point of the striation with the axis O-O' is defined as the "height of striation", as shown in FIG. 1D. Although the striations exemplified in FIG. 1D have substantially M-like shapes, striations generally occur in various shapes including two extremes, i.e. a shape convex upward along the axis O-O' (which shape will be referred to as "+" in striation height, hereinafter) and a shape convex downward along the axis O-O' (which shape will be referred to as "−" in striation height, hereinafter).

Next, crystal silicon ingots having various values of resistivity are prepared under various production conditions by changing an added amount of dopant(s). Presence/absence of cell growth and the height of striation are analyzed for each of the thus obtained silicon ingots. Presence/absence of cell growth is analyzed by carrying out an X-ray observation as described above.

Figure 3:
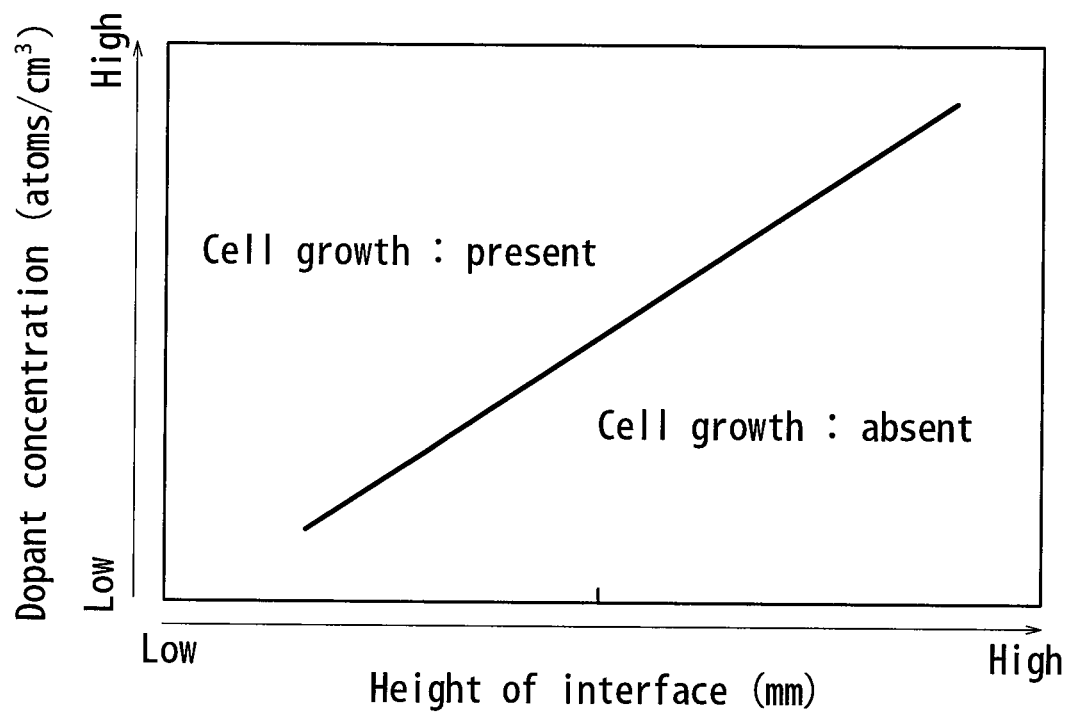
FIG. 3 is a view showing a relationship between resistivity of a single crystal silicon and a height of a striation.

The results of the analyses are shown in FIG. 3. It has been newly revealed that cell growth occurs or does not occur, depending on the magnitude of the height of a striation. Each striation represents a solid-liquid interface during crystal growth, as described above. Accordingly, the height of a striation can be regarded as the height of a solid-liquid interface during crystal growth (which height of a solid-liquid interface will be referred to simply as "height of interface" hereinafter). It has been newly revealed that single crystal silicon having a desired low resistivity can be produced without causing cell growth to occur by controlling the aforementioned height of interface. In the present embodiment, a height of a striation is regarded as synonymous with a height of an interface hereinafter.

Conventionally, when single crystal silicon having relatively low resistivity is produced by adding a relatively large amount of dopant thereto, cell growth occurs and single crystallization is inhibited. However, according to the present invention, dislocation-free crystal growth without cell growth is realized by appropriately controlling the height of interface during the pulling-up operation of a crystal, such that single crystal silicon having relatively low resistivity can be reliably produced.

In the present embodiment, the height of interface for realizing crystal growth without cell growth changes, depending on the conditions including: the type of dopamt; an added amount of dopant (resistivity); and the diameter of an ingot. Accordingly, it suffices to determine in advance an appropriate height of interface which height will not cause cell growth to occur, depending on the aforementioned conditions, and to carry out the pulling-up operation of single crystal silicon by controllably setting a height of an interface at the appropriate height of interface in accordance with the desired resistivity thus determined.

In view of this, a height of interface in accordance with resistivity, which height is required for preventing cell growth from occurring, has been specifically obtained for specific type(s) of dopant(s) by experiments similar to those described above. The results are shown in FIGS. 4A, 4B, 5A and 5B.

(i) Dopant: P and (P+Ge)

Figure 4A:
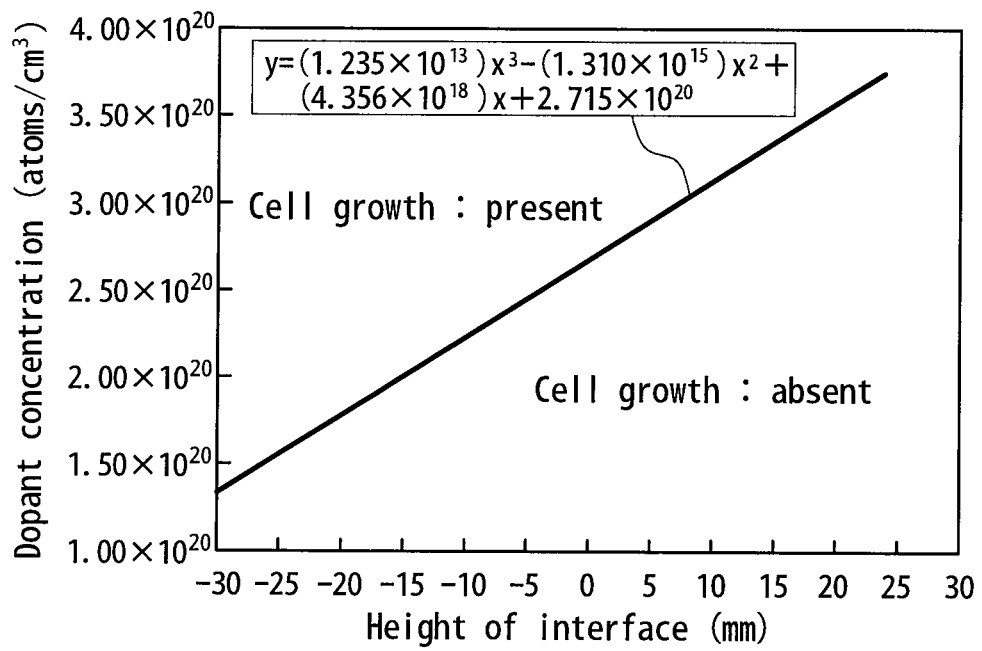
FIGS. 4A and 4B are views each showing a relationship between resistivity of a single crystal silicon and a height of a striation.
Figure 4B:
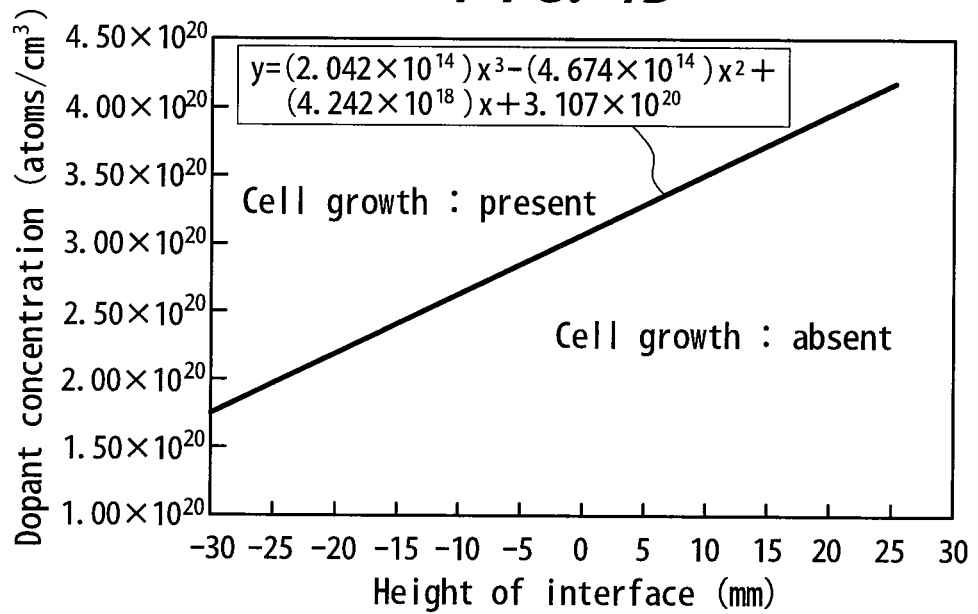

Crystal silicons are produced by adding various amounts of (P+Ge) as dopant to change resistivity thereof and also setting heights of interface of the crystal silicons having the same resistivity at various heights during the pulling-up operation thereof. The height of striation as the height of interface is measured and presence/absence of cell growth is investigated for each of the silicon ingots thus obtained. The results of the cases where the ingot diameter is 8 inches and the results of the cases where the ingot diameter is 6 inches are shown in FIGS. 4A and 4B, respectively.

Since a Ge concentration "$[Ge]_L$" in a molten silicon is converted to a P concentration according to a formula (A) below (i.e. a Ge concentration in a molten silicon is converted to a P concentration as a converted concentration $[Ge{\rightarrow}P]_L$), the dopant concentration [y] of the (P+Ge) silicon molten can be eventually expressed by the formula (B) below. That is, cases where P is used as a dopant and cases where (P+Ge) are used as dopants can be amalgamated into the cases of the same dopant by way of the concentration conversion described above. Accordingly, in the present embodiment, experiments are carried out only for cases where (P+Ge) are added as dopants and experiments for cases where P is added as a dopant is omitted. It should be noted that the conversion formulae described above are based on the descriptions in JP 2008-297166 Laid-Open.

$$[Ge{\rightarrow}P]_L = (0.3151 \times [Ge]_s + 3.806 \times 10^{18})/k \quad (A)$$

wherein $[Ge]_s$: Solid concentration of Ge
k: Segregation coefficient $$[y] = [P]_L + [Ge{\rightarrow}P]_L/1.5 \quad (B)$$

wherein $[P]_L$: P concentration in a molten silicon

As shown in FIGS. 4A and 4B, provided that the dopant concentration is y and the height of interface is x, the border line of presence/absence of cell growth is:

$$y \leq (1.235 \times 10^{13})x^3 - (1.310 \times 10^{15})x^2 + (4.356 \times 10^{18})x + 2.715 \times 10^{20}$$

when the ingot diameter is 8 inches; and $$y \leq (2.042 \times 10^{14})x^3 - (4.674 \times 10^{14})x^2 + (4.242 \times 10^{18})x + 3.107 \times 10^{20}$$

when the ingot diameter is 6 inches.

Accordingly, in a case where dopant is P and a case where dopants are P+Ge, cell growth is prevented from occurring and dislocation-free crystal growth is achieved by controlling the height of interface "x" such that x satisfies the following formulae, respectively:

$$y \leq (1.235 \times 10^{13})x^3 - (1.310 \times 10^{15})x^2 + (4.356 \times 10^{18})x + 2.715 \times 10^{20}$$

when the ingot diameter is 8 inches; and $$y \leq (2.042 \times 10^{14})x^3 - (4.674 \times 10^{14})x^2 + (4.242 \times 10^{18})x + 3.107 \times 10^{20}$$

when the ingot diameter is 6 inches.

Similarly, appropriate interface heights are obtained also in cases where As is used as dopant. The results as shown in FIG. 5 are obtained.

(ii) Dopant: As

Figure 5A:
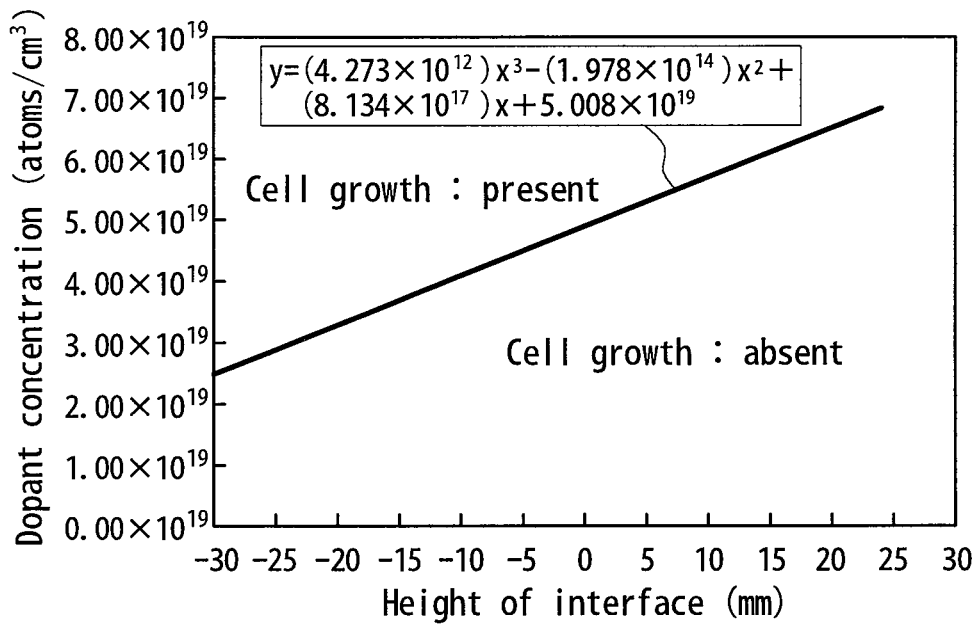
FIGS. 5A and 5B are views each showing a relationship between resistivity of a single crystal silicon and a height of a striation.
Figure 5B:
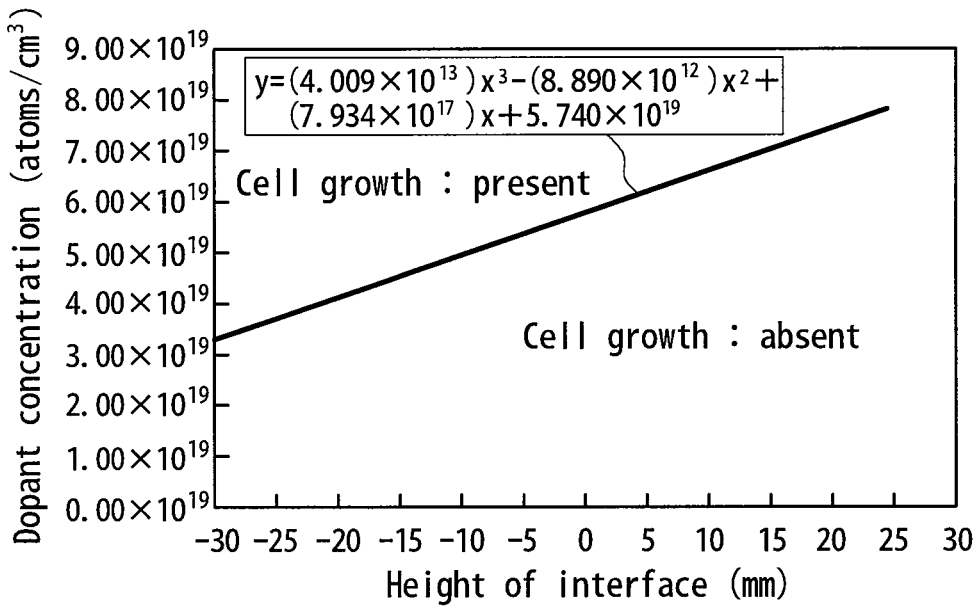

As shown in FIGS. 5A and 5B, in cases where As is used as dopant, the border line of presence/absence of cell growth is:

$$y \leq (4.273 \times 10^{12})x^3 - (1.978 \times 10^{14})x^2 + (8.134 \times 10^{17})x + 5.008 \times 10^{19}$$

when the ingot diameter is 8 inches; and $$y \leq (4.009 \times 10^{13})x^3 - (8.890 \times 10^{12})x^2 + (7.934 \times 10^{17})x + 5.740 \times 10^{19}$$

when the ingot diameter is 6 inches.

Accordingly, in a case where dopant is As, cell growth is prevented from occurring and dislocation-free crystal growth is achieved by controlling the height of interface "x" such that x satisfies the following formulae, respectively:

$$y \leq (4.273 \times 10^{12})x^3 - (1.978 \times 10^{14})x^2 + (8.134 \times 10^{17})x + 5.008 \times 10^{19}$$

when the ingot diameter is 8 inches; and $$y \leq (4.009 \times 10^{13})x^3 - (8.890 \times 10^{12})x^2 + (7.934 \times 10^{17})x + 5.740 \times 10^{19}$$

when the ingot diameter is 6 inches.

Figure 6:
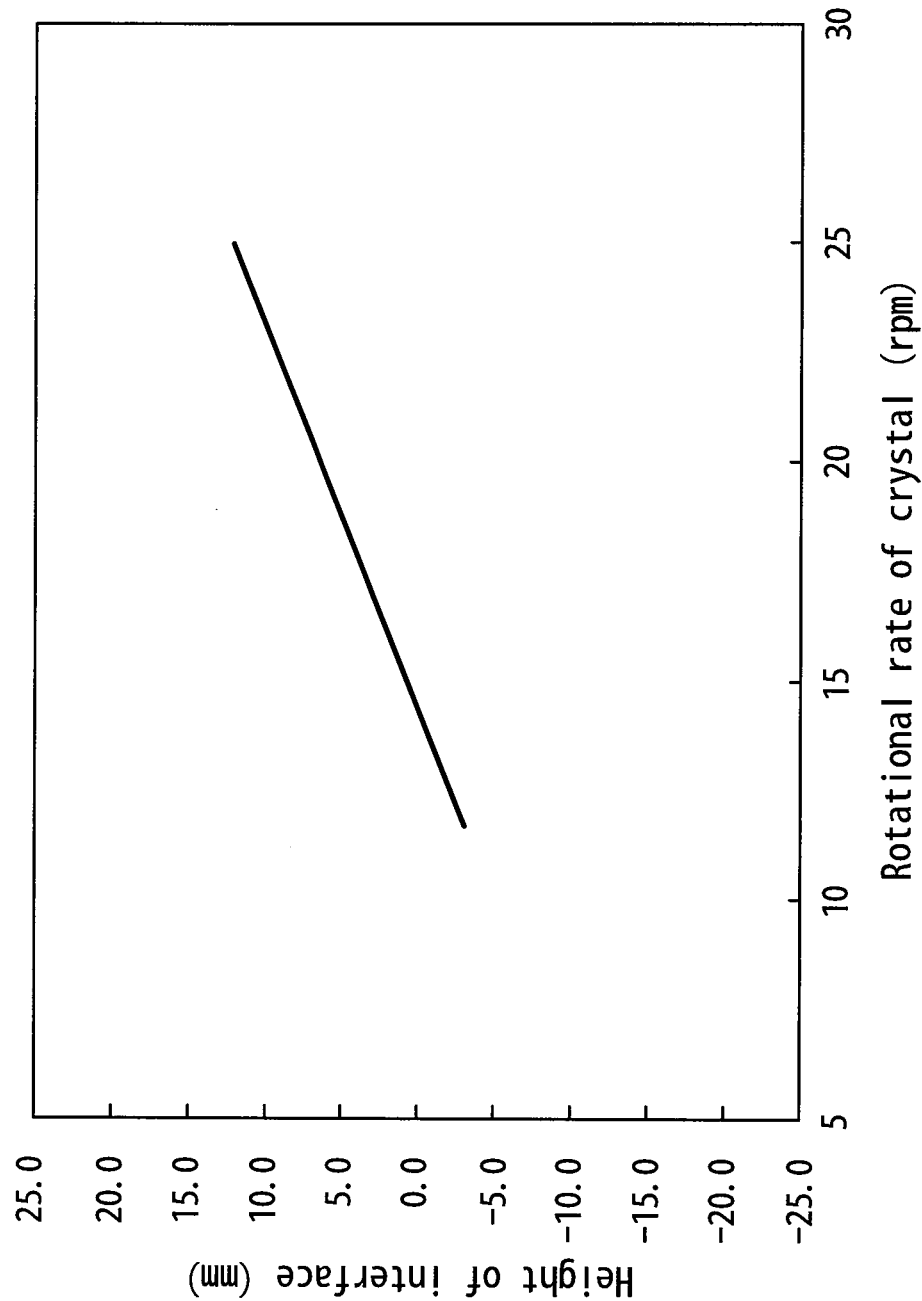
FIG. 6 is a view showing a relationship between a height of an (striation) interface and a rotational rate of single crystal silicon.
Figure 7:
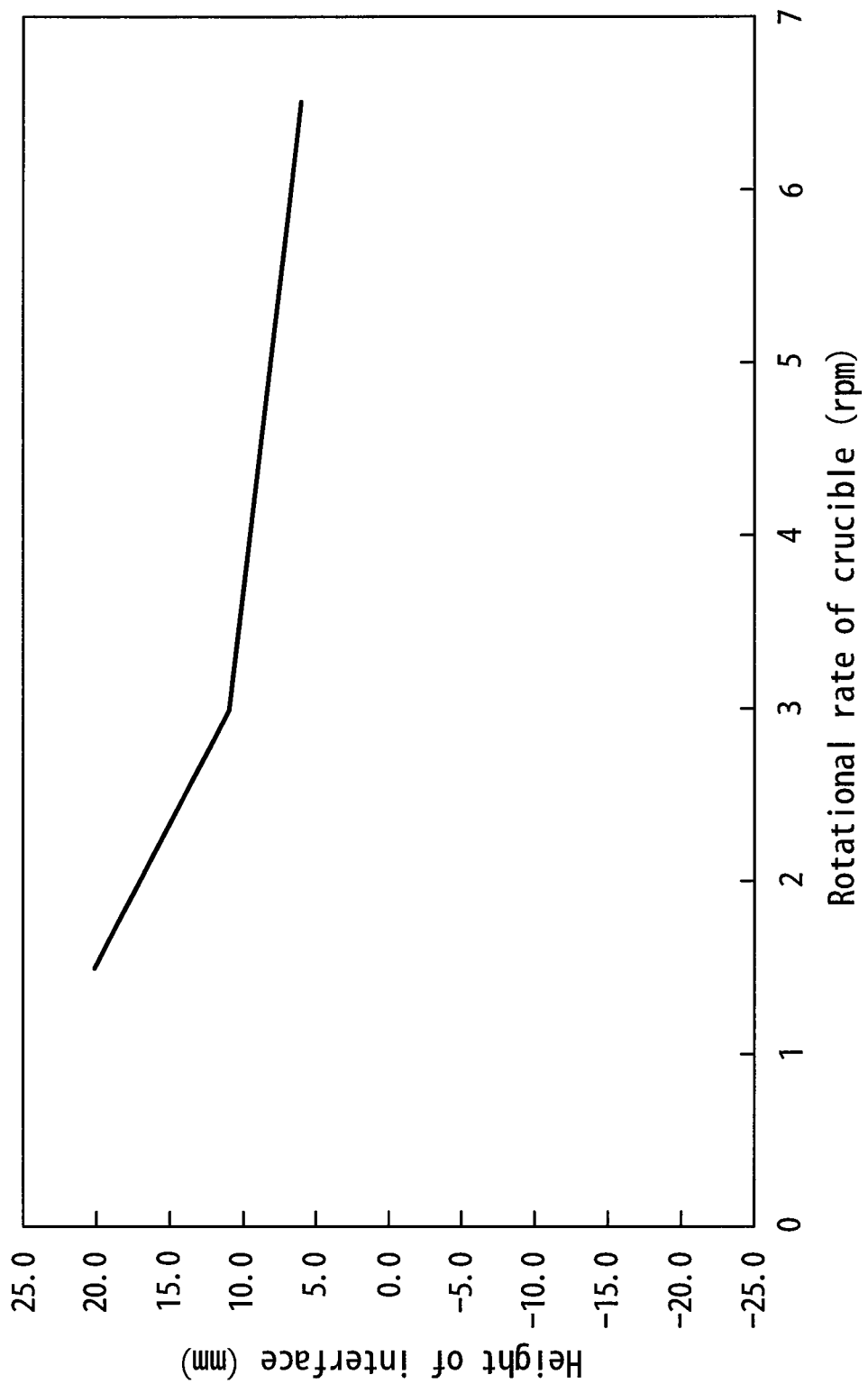
FIG. 7 is a view showing a relationship between a height of an (striation) interface and a rotational rate of a crucible.
Figure 8:
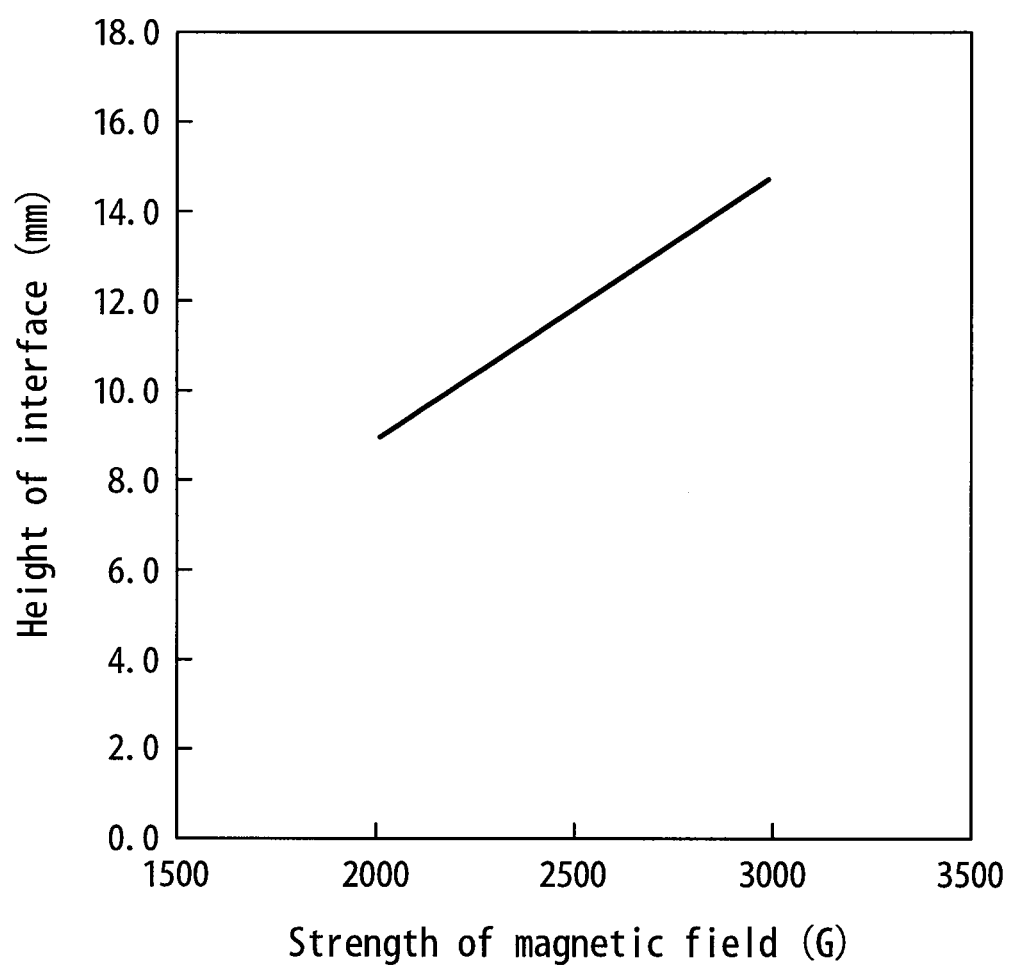
FIG. 8 is a view showing a relationship between a height of an (striation) interface and strength of magnetic field applied to a molten silicon.

In the present embodiment, control of the interface height can be achieved by adjusting at least one of the various conditions at the time of pulling up a crystal. Specifically, it is preferable to control the interface height by adjusting at least one of a rotational rate of crystal, a rotational rate of a crucible, and strength of a magnetic field applied to a molten silicon during the pulling-up operation of the crystal. More specifically, a relationship between a rotational rate of crystal and an interface height during the pulling-up operation of the crystal is shown in FIG. 6, a relationship between a rotational rate of a crucible and an interface height during the pulling-up operation of crystal is shown in FIG. 7, and a relationship between strength of a magnetic field and an interface height during the pulling-up operation of crystal is shown in FIG. 8, respectively. In each of the relationships described above, correlation of the specified condition with the interface height is obvious and it is easy to set, based on the data, specific conditions which will enable obtaining a desired height of interface.

In each of the relationships shown in FIGS. 6-8, only the targeted specific condition is varied, while other conditions remain unchanged, during the operation of pulling up single crystal silicon having 6 or 8 inch diameter and then the interface height (height of a striation) in the obtained ingot is measured.

Figure 9:
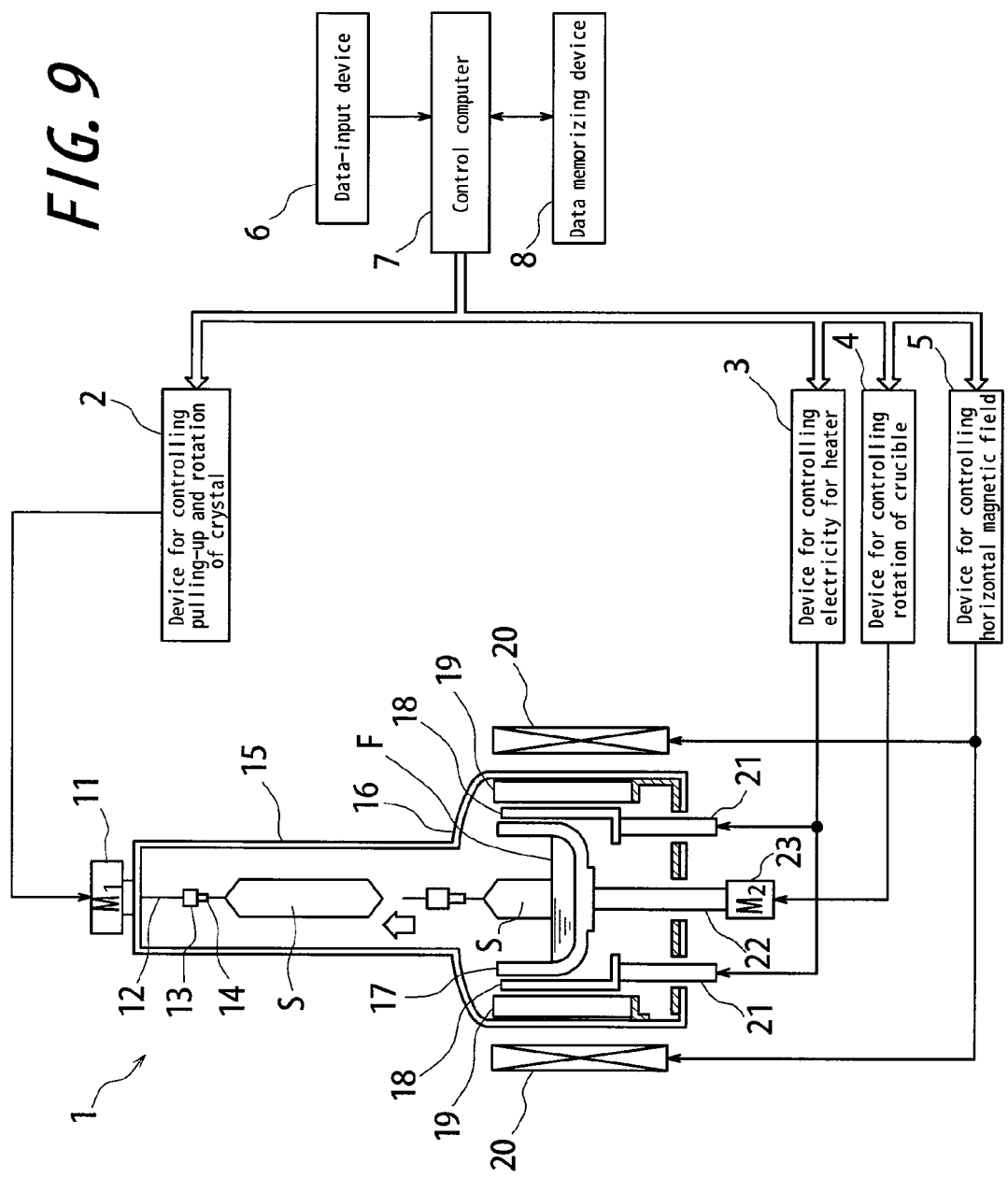
FIG. 9 is a schematic view of a system for controlling production of single crystal silicon according to the present invention.

Next, an apparatus for pulling up single crystal silicon, to which the aforementioned method of producing single crystal silicon of the present invention is applied, will be described in detail with reference to the drawings. FIG. 9 is a schematic diagram of facilities for producing single crystal silicon adapted to the present invention. Although a system for growing crystal according to the magnetic-field-applied Czochralski method will be described as a representative example, it should be noted that the present invention is applicable to a Czochralski crystal growth system not involving control of a magnetic field.

As shown in FIG. 9, the facilities for producing single crystal silicon include a crystal pulling-up device 1, a device 2 for controlling pulling-up and rotation of a crystal, a device 3 for controlling electricity for a heater, a device 4 for controlling rotation of a crucible, a device 5 for controlling a horizontal magnetic field, a data-input device 6, a control computer 7, and a data memorizing device 8.

The crystal pulling-up device 1 is a device for effecting a pulling-up operation of a singe crystal silicon. The inside of a chamber of the crystal pulling-up device 1, which chamber is constituted of a pull chamber 15 and a main chamber 16, is maintained in a predetermined air-tight state by supplying or discharging an inert gas such as argon gas (not shown).

A crucible 17 (for example, the outer side thereof is constituted of a graphite crucible and the inner side thereof is constituted of a quartz crucible) is provided inside the main chamber 16 so as to be rotatable around a rotational axis 22. The rotational axis 22 is rotated at a desired rotational rate by a motor (M2). The motor (M2) 23 is connected to the device 4 for controlling rotation of the crucible. The device 4 for controlling rotation of the crucible is connected to the control computer 7 and capable of adjusting a rotational rate of the crucible 17 by a control signal from the control computer 7. The device 4 for controlling rotation of the crucible is also capable of controlling movement of the crucible 17 in the vertical direction, in addition to adjusting a rotational rate of the crucible 17.

A heater 18 for melting a silicon raw material, which is to be a molten raw material (F) inside the crucible 17, is provided so as to surround the crucible 17. The heater 18 is connected, by way of an electrode terminal 21 for the heater, to the device 3 for controlling electricity for the heater. The device 3 for controlling electricity for the heater is connected to the control computer 7 and adapted to control electricity supplied for adjusting quantity of heat of the heater 18 in accordance with a control signal from the control computer 7.

A single crystal silicon pulling-up device 11 for pulling up single crystal silicon S is provided at the top portion of the pull chamber 15. The single crystal silicon pulling-up device 11 is an equipment capable of pulling up the single crystal silicon S at a predetermined pulling-up rate and a predetermined rotational rate and may be constituted, for example, of a multi-spindle motor (M1). The single crystal silicon pulling-up device 11 is connected to the device 2 for controlling pulling-up and rotation of crystal. The device 2 for controlling pulling-up and rotation of crystal is connected to the control computer 7 and adapted to be capable of adjusting by a control signal from the control computer 7 a pulling-up rate and a rotational rate of single crystal silicon S effected by the single crystal silicon pulling-up device 11.

A coil 20 for generating a horizontal magnetic field with respect to the (molten) silicon raw material by way of a magnetic-permeable insulating material 19 is provided around the main chamber 16 in the direction of a horizontal plane orthogonal to the pulling-up direction (the vertical direction in FIG. 9) of the single crystal silicon. Dopant such as phosphorus (P), antimony (Sb), arsenic (As), germanium (Ge), or the like is added to the molten silicon raw material (F). The coil 20 is connected to the device 5 for controlling a horizontal magnetic field. The device 5 for controlling a horizontal magnetic field is connected to the control computer 7 and is adapted to be capable of adjusting a magnetic field of the coil 20 by a control signal from the control computer 7.

A wire 12 is suspended from the single crystal silicon pulling-up device 11 inside the pull chamber 15 such that the wire can be rotatable and movable in the vertical direction. A seed crystal holder 13 for holding a seed crystal 14 is provided at the rear end of the wire 12.

Accordingly, single crystal silicon S can be pulled up as the single crystal silicon S is grown, by immersing the seed crystal 14 in the molten silicon raw material (F) and gradually pulling up the seed crystal 14 with rotating the wire 12.

In the present embodiment, the data-input device 6 and the data memorizing device 8 are connected to the control computer 7, and the data memorizing device 8 stores data of growth condition of single crystal silicon (parameters of the pulling-up rate and the rotational rate of single crystal silicon S, electricity for the heater, the rotational rate and the vertical shift position of the crucible, strength of a horizontal magnetic field, and the like). Further, the data-input device 6 has a function of setting in the control computer 7 information including a desired value of wafer size, the types of dopants, the range of resistivity of single crystal silicon, and the like. The control computer 7: reads out relevant data of growth conditions of single crystal silicon stored in the data memorizing device 8, based on the desired value of wafer size, the type(s) of dopant(s) and the targeted value of resistivity of single crystal silicon; determines the parameter values for obtaining a desired single crystal silicon; and transmits control signals corresponding to the respective parameters to the device 2 for controlling pulling-up and rotation of crystal, the device 3 for controlling electricity for the heater, the device 4 for controlling rotation of the crucible, and the device 5 for controlling a horizontal magnetic field, respectively.

As described above, the system for growing crystal according to the magnetic-field-applied Czochralski method as shown in FIG. 9 can grow single crystal silicon with controlling height of interface by setting growth conditions for realizing a desired resistivity in accordance with a specification and an object of single crystal silicon.

In the present embodiment, the data shown in FIGS. 4A to 6 are stored as "resistivity control data" in the data memorizing device 8 in order to produce single crystal silicon having relatively low resistivity without cell growth in a case where a desired resistivity is extremely low (e.g. 0.5 to 1.4 mΩ·cm) or a case where single crystal having resistivity in a predetermined range is to be formed. The control computer 7: reads out respective parameters of the growth condition data of single crystal silicon, with reference to the "resistivity control data", to determine the parameter values for obtaining a desired single crystal silicon; and transmits control signals corresponding to the respective parameters to the device 2 for controlling pulling-up and rotation of crystal, the device 3 for controlling electricity for the heater, the device 4 for controlling rotation of the crucible, and the device 5 for controlling a horizontal magnetic field, respectively.

Figure 10:
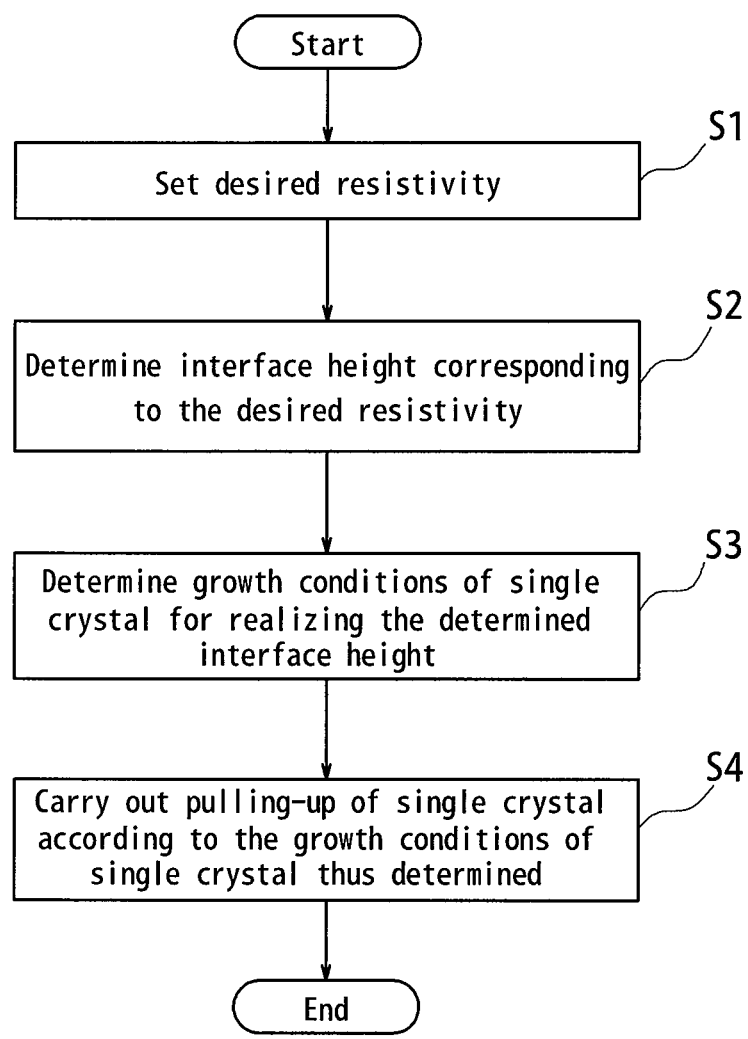
FIG. 10 is a flowchart of production of single crystal silicon by using the system for controlling production of single crystal silicon of the present invention.

FIG. 10 is a flowchart showing the steps of producing single crystal silicon by the single crystal silicon producing device of the present invention. The "resistivity control data" is the data as shown in FIGS. 4A, 4B, 5A and 5B, which may be stored in advance in the data memorizing device 8.

Specifically, data representing "a relationship between resistivity of single crystal silicon and height of interface", in addition to the data of growth conditions of single crystal silicon (parameters of the pulling-up rate and the rotational rate of single crystal silicon S, electricity for the heater, the rotational rate and the vertical shift position of the crucible, strength of a horizontal magnetic field, and the like, described above) and the types of dopants, are acquired in advance, whereby production of single crystal silicon having relatively low resistivity can be easily realized without causing cell growth. Further, the aforementioned data representing "a relationship between resistivity of single crystal silicon and height of interface" can be utilized not only for the method of producing single crystal silicon having relatively low resistivity but also for realizing sound growth of single crystal silicon having any desired resistivity.

The steps of producing single crystal silicon having relatively low resistivity, while suppressing cell growth, will be described with reference to FIG. 10. In the present embodiment, at the stage of adding dopant such as phosphorus, germanium, arsenic or the like to the molten silicon raw material (F) obtained by melting a polycrystal silicon raw material charged in the crucible 17 and then bringing a seed crystal made of single crystal silicon into contact with the molten silicon raw material containing the dopant dissolved therein, to grow single crystal silicon, following steps are carried out.

In step S1, a desired resistivity is set in the control computer 7 by way of the data-input device 6.

In step S2, the control computer 7 determines the interface height corresponding to the desired resistivity thus inputted, with reference to the data representing "a relationship between resistivity of single crystal silicon and height of interface" (FIGS. 4A to 5B) stored in the data memorizing device 8.

In step S3, the control computer 7 determines the growth conditions of single crystal silicon for satisfactorily realizing the determined height of interface, as the parameter values for obtaining the desired single crystal silicon, with reference to the data of growth conditions of single crystal silicon (i.e. parameters of the pulling-up rate and the rotational rate of single crystal silicon S, electricity for the heater, the rotational rate of the crucible, strength of a horizontal magnetic field, and the like, as described above) stored in the data memorizing device 8.

Data for determining the aforementioned respective parameters of the growth conditions of single crystal silicon in accordance with the determined "height of interface" (e.g. the data as shown in FIGS. 6 to 8) are prepared for each of the parameters and stored in the data memorizing device 8 in advance.

In step S4, the control computer 7 transmits control signals corresponding to the respective parameters thus determined to the device 2 for controlling pulling-up and rotation of crystal, the device 3 for controlling electricity for the heater, the device 4 for controlling rotation of the crucible, and the device 5 for controlling a horizontal magnetic field, respectively, to carry out the operation of pulling up single crystal silicon.

In the present embodiment, it is desired that the single crystal silicon to be served for the aforementioned power device has resistivity not higher than 1.4 mΩ·cm. For example, in a case where P is used as dopant, since the dopant concentration of P which realizes resistivity not higher than 1.4 mΩ·cm is $1.82 \times 10^{20}$ atoms/cm$^3$ or more, single crystal silicon of such low resistivity can be obtained by controlling the height of interface during the growth of single crystal silicon such that the height of the interface does not drop below −20 mm in accordance with the teaching of FIGS. 4A and 4B. Defining the suitable upper limit value of interface height is not particularly necessary because resistivity is substantially in an equilibrium state when the height of interface is 25 mm or more. However, in a case where defining the upper limit value is necessary for controlling the parameters, the suitable height of interface can be defined, for example, in the range of −20 mm to +25 mm in the example described above.

Further, in an aspect of the present invention, the control computer 7 can be realized by a general purpose computer. A program for implementing the respective steps shown in FIG. 10 can be stored in a memory device for storing data (which may be the aforementioned data memorizing device 8) provided internally or externally of the general purpose computer. The control portion provided in the computer can be realized by control through a central processing unit (CPU). Specifically, the CPU reads in an appropriate manner a program for implementing the contents of the respective processes and including the descriptions of the contents, to carry out the respective steps shown in FIG. 10. In the present embodiment, the respective steps may be implemented by a part of a hardware.

Yet further, the program including the descriptions of the contents of the processes can be circulated by sale, transfer, rental business, or the like of a portable recording medium such as DVD or CD-ROM. Such a program as described above can be circulated, for example, by storing the program in a storage portion of a server existing on a network and then transferring the program from the server to another computer via the network.

A computer executing such a program as described above may temporarily store the program recorded in the portable recording medium or the program transferred from the server in the memory storage portion of itself. In another embodiment of the present invention, the computer may directly read the program from a portable recording medium and executes the processes according to the program. Further, the computer may execute, whenever a program is transferred from the server to the computer, processes according to the received program.

In the foregoing descriptions, the embodiments of the present invention are described in detail with reference to specific examples thereof. It should be noted that any modifications and/or changes can be made to these embodiments unless they digress from the scope of the accompanying claims of the present invention. For example, although a system for growing crystal according to the magnetic-field-applied Czochralski method is described in the foregoing descriptions, it is possible to apply the present invention to a system for growing crystal according to the Czochralski method not using a horizontal magnetic field. Further, the present invention can be applied without any limitation to a specific wafer size, a specific dopant, and the like. Accordingly, the present invention is not restricted to the foregoing embodiments.

According to the present invention, single crystal silicon can be grown with setting the height of interface at an appropriate level, such that single crystal silicon of relatively low resistance can be produced or single crystal silicon of any desired resistivity can be produced.

What is claimed is:

1. A method of producing single crystal silicon by the Czochralski process, comprising at a stage of adding dopant to a molten silicon raw material obtained by melting a polycrystal silicon raw material charged in a crucible and then bringing a seed crystal made of single crystal silicon into contact with the molten silicon raw material containing the dopant dissolved therein, to grow the single crystal silicon, the steps of:

setting crystal diameter, type of dopant and dopant concentration corresponding to a desired resistivity for the single crystal silicon in a control computer;

based on stored data representing a relationship between the dopant concentration and a borderline height of a solid-liquid interface during crystal growth below which cell growth due to constitutional undercooling occurs, wherein the borderline height of the solid-liquid interface during crystal growth is retrospectively determined based on a height of a striation of a resulting single crystal silicon, utilizing the control computer to determine at least one parameter value for growth conditions of the single crystal silicon in order to realize a height of the solid-liquid interface above or equal to the borderline height of the solid-liquid interface, said at least one parameter value comprising at least one of a pulling-up rate of the single crystal silicon, a rotational rate of the single crystal silicon, electricity for a heater for melting the silicon raw material, a rotational rate of the crucible, and a strength of a horizontal magnetic field; and utilizing the control computer to control at least one of the rate of pulling-up the single crystal silicon, rotating the single crystal silicon, heating the silicon raw material, rotating the crucible, and applying the horizontal magnetic field according to the at least one determined parameter value, while pulling up the single crystal silicon.

2. The method of producing single crystal silicon of claim 1, wherein said relationship between the dopant concentration and the borderline height of the solid-liquid interface is represented by formula (1) below, provided that: the size of a single crystal silicon to be produced is 8-inch diameter; Phosphorous and Germanium are added as the dopant; x is the borderline height of the solid-liquid interface (mm); and y is the dopant concentration (atoms/cm$^3$):

$$Y=(1.235*10^{13})x^3-(1.310*10^{15})x^2+(4.356*10^{18})x+2.715*10^{20}. \qquad (1)$$

3. The method of producing single crystal silicon of claim 1, wherein said relationship between the dopant concentration and the borderline height of the solid-liquid interface is represented by formula (2) below, provided that: the size of a single crystal silicon to be produced is 6-inch diameter; Phosphorous and Germanium are added as the dopant; x is the borderline height of the solid-liquid interface (mm); and y is the dopant concentration (atoms/cm$^3$):

$$Y=(2.042*10^{14})x^3-(4.674*10^{14})x^2+(4.242*10^{18})x+3.107*10^{20}. \qquad (2)$$

4. The method of producing single crystal silicon of claim 1, wherein said relationship between the dopant concentration and the borderline height of the solid-liquid interface is represented by formula (3) below, provided that: the size of a single crystal silicon to be produced is 8-inch diameter; Phosphorous is added as the dopant; x is the borderline height of the solid-liquid interface (mm); and y is the dopant concentration (atoms/cm$^3$):

$$Y=(1.235*10^{13})x^3-(1.310*10^{15})x^2+(4.356*10^{18})x+2.715*10^{20}. \qquad (3)$$

5. The method of producing single crystal silicon of claim 1, wherein said relationship between the dopant concentration and the borderline height of the solid-liquid interface is represented by formula (4) below, provided that: the size of a single crystal silicon to be produced is 6-inch diameter; Phosphorous is added as the dopant; x is the borderline height of the solid-liquid interface (mm); and y is the dopant concentration (atoms/cm$^3$):

$$Y=(2.042*10^{14})x^3-(4.674*10^{14})x^2+(4.242*10^{18})x+3.107*10^{20}. \qquad (4)$$

6. The method of producing single crystal silicon of claim 1, wherein said relationship between the dopant concentration and the borderline height of the solid-liquid interface is represented by formula (5) below, provided that: the size of a single crystal silicon to be produced is 8-inch diameter; Arsenic is added as the dopant; x is the height of a solid-liquid interface (mm); and y is the dopant concentration (atoms/cm$^3$):

$$Y=(4.273*10^{12})x^3-(1.978*10^{14})x^2+(8.134*10^{17})x+5.008*10^{19}. \qquad (5)$$

7. The method of producing single crystal silicon of claim 1, wherein said relationship between the dopant concentration and the borderline height of the solid-liquid interface is represented by formula (6) below, provided that: the size of a single crystal silicon to be produced is 6-inch diameter; Arsenic is added as the dopant; x is the height of a solid-liquid interface (mm); and y is the dopant concentration (atoms/cm$^3$):

$$Y=(4.009*10^{13})x^3-(8.890*10^{12})x^2+(7.934*10^{17})x+5.740*10^{19}. \qquad (6)$$

8. The method of producing single crystal silicon of claim 4, wherein the single crystal silicon thus produced has resistivity not higher than 1.4 mΩ cm.

9. The method of producing single crystal silicon of claim 5, wherein the single crystal silicon thus produced has resistivity not higher than 1.4 mΩ cm.

* * * * *